(12) United States Patent
Rubinsztain et al.

(10) Patent No.: US 10,746,814 B2
(45) Date of Patent: Aug. 18, 2020

(54) DIAGNOSTIC METHODS AND APPARATUS FOR MAGNETIC FIELD SENSORS

(71) Applicant: Allegro MicroSystems, LLC, Manchester, NH (US)

(72) Inventors: Ezequiel Rubinsztain, Buenos Aires (AR); Pablo Javier Bolsinger, Buenos Aires, AR (US)

(73) Assignee: Allegro MicroSystems, LLC, Manchester, NH (US)

( * ) Notice: Subject to any disclaimer, the term of this patent is extended or adjusted under 35 U.S.C. 154(b) by 209 days.

(21) Appl. No.: 16/014,075

(22) Filed: Jun. 21, 2018

(65) Prior Publication Data

US 2019/0391212 A1 Dec. 26, 2019

(51) Int. Cl.
*G01R 33/00* (2006.01)
*G01R 33/02* (2006.01)
*G01R 35/00* (2006.01)

(52) U.S. Cl.
CPC ......... *G01R 33/0023* (2013.01); *G01R 33/02* (2013.01); *G01R 35/00* (2013.01)

(58) Field of Classification Search
CPC ...... G01R 31/00; G01R 31/28; G01R 31/282; G01R 31/2829; G01R 33/00; G01R 33/0023; G01R 33/0029; G01R 33/02; G01R 33/06; G01R 35/00; G01R 33/0035; G01R 33/07; G01R 33/075; G01R 35/005
USPC ....... 324/200, 202, 260, 500, 512, 527, 528, 324/529, 179; 702/1, 33, 35, 38, 108, 702/113, 115
See application file for complete search history.

(56) References Cited

U.S. PATENT DOCUMENTS

| | | | |
|---|---|---|---|
| 6,815,944 B2 | 11/2004 | Vig et al. | |
| 7,026,808 B2 | 4/2006 | Vig et al. | |
| 7,323,870 B2 * | 1/2008 | Tatschl | G01L 25/00 257/E27.005 |
| 7,694,200 B2 | 4/2010 | Forrest et al. | |
| 7,800,389 B2 | 9/2010 | Friedrich et al. | |
| 7,923,996 B2 | 4/2011 | Doogue et al. | |
| 8,030,918 B2 | 10/2011 | Doogue et al. | |
| 8,447,556 B2 | 5/2013 | Friedrich et al. | |

(Continued)

OTHER PUBLICATIONS

Response to Office Action filed Dec. 19, 2019 for European Application No. 19177769.7; 3 pages.

(Continued)

*Primary Examiner* — Hoai-An D. Nguyen
(74) *Attorney, Agent, or Firm* — Daly, Crowley, Mofford & Durkee, LLP (57) ABSTRACT

Apparatus and methods provide an output signal indicative of a failure of a filter circuit and/or a Schmitt trigger circuit of a magnetic field sensor. A magnetic field sensor includes one or more magnetic field sensing elements that generate a magnetic field signal, a filter circuit that filters the magnetic field signal, a Schmitt trigger circuit that compares the filtered signal to a Schmitt trigger threshold during a first time period, and a diagnostic circuit coupled to the filter circuit that compares the Schmitt trigger threshold to a diagnostic threshold during a second time period that does not overlap with the first time period. An output signal indicative of a failure is output when the diagnostic threshold is greater than a predetermined percentage or absolute value above or below the Schmitt trigger threshold.

20 Claims, 7 Drawing Sheets

(56) References Cited

U.S. PATENT DOCUMENTS

| | | |
|---|---|---|
| 8,542,010 B2 | 9/2013 | Cesaretti et al. |
| 8,680,846 B2 | 3/2014 | Cesaretti et al. |
| 8,692,546 B2 | 4/2014 | Cesaretti et al. |
| 8,754,640 B2 | 6/2014 | Vig et al. |
| 8,818,749 B2 | 8/2014 | Friedrich et al. |
| 8,860,404 B2 | 10/2014 | Dwyer et al. |
| 8,890,518 B2 | 11/2014 | Daubert |
| 8,937,797 B2 | 1/2015 | Pirchio et al. |
| 9,151,807 B2 | 10/2015 | Friedrich et al. |
| 9,164,826 B2 | 10/2015 | Fernandez |
| 9,201,122 B2 | 12/2015 | Cesaretti et al. |
| 9,222,990 B2 | 12/2015 | Dwyer et al. |
| 9,383,425 B2 | 7/2016 | Milano et al. |
| 9,645,220 B2 | 5/2017 | Cesaretti et al. |
| 9,817,078 B2 | 11/2017 | Pepka et al. |
| 9,910,088 B2 | 3/2018 | Milano et al. |
| 10,001,519 B2 | 6/2018 | Choe et al. |
| 2010/0237890 A1 | 9/2010 | Motz et al. |
| 2010/0308879 A1 | 12/2010 | Ishizaki |
| 2011/0018533 A1* | 1/2011 | Cesaretti ............ G01R 33/0035 324/251 |
| 2011/0221518 A1 | 9/2011 | Romero |
| 2012/0313635 A1* | 12/2012 | Daubert ............... G01R 33/077 324/251 |
| 2013/0335066 A1 | 12/2013 | Cesaretti et al. |
| 2014/0266181 A1 | 9/2014 | Milano et al. |
| 2015/0185284 A1 | 7/2015 | Milano et al. |
| 2015/0185293 A1 | 7/2015 | Milano et al. |
| 2016/0139199 A1* | 5/2016 | Petrie ................... G01D 5/2449 324/750.3 |
| 2017/0016965 A1 | 1/2017 | Chaware et al. |
| 2017/0176566 A1* | 6/2017 | Monreal ............ G01R 33/0035 |
| 2018/0011150 A1 | 1/2018 | Pepka et al. |
| 2018/0017616 A1* | 1/2018 | Petrie .................... G01R 33/09 |
| 2018/0136999 A1 | 5/2018 | Fernandez |

OTHER PUBLICATIONS

U.S. Appl. No. 15/622,459, filed Jun. 14, 2017, Haas.
U.S. Appl. No. 15/657,324, filed Jul. 24, 2017, Drouin.
U.S. Appl. No. 15/782,163, filed Oct. 12, 2017, Cook.
U.S. Appl. No. 15/825,879, filed Nov. 29, 2017, Lassalle-Balier.
U.S. Appl. No. 15/901,135, filed Feb. 21, 2018, Romero.
U.S. Appl. No. 15/928,689, filed Mar. 22, 2018, Petrie.
Extended Search Report dated Feb. 26, 2020 for European Application No. 19177769.7; 8 pages.

* cited by examiner

DIAGNOSTIC METHODS AND APPARATUS FOR MAGNETIC FIELD SENSORS

CROSS REFERENCE TO RELATED APPLICATIONS

Not Applicable.

STATEMENT REGARDING FEDERALLY SPONSORED RESEARCH

Not Applicable.

FIELD

The present disclosure relates generally to diagnostic methods for magnetic field sensors.

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples.

Sensor integrated circuits are widely used in automobile control systems and other safety critical applications. There are a variety of specifications that set forth requirements related to permissible sensor quality levels, failure rates, and overall functional safety.

SUMMARY

The present disclosure can provide a magnetic field sensor that provides failure information regarding the magnetic field sensor. Some embodiments generate an output signal indicative of a failure of the Schmitt trigger threshold.

According to the disclosure, a magnetic field sensor comprises one or more magnetic field sensing elements configured to generate a magnetic field signal responsive of a magnetic field, a filter circuit coupled to receive a signal representative of the magnetic field signal and configured to generate a filtered signal, a Schmitt trigger circuit coupled to receive the filtered signal and configured to compare the filtered signal to a Schmitt trigger threshold during a first time period, and a diagnostic circuit configured to couple a diagnostic signal to the filter circuit, wherein the Schmitt trigger circuit is configured to compare the Schmitt trigger threshold to the diagnostic signal during a second time period. The magnetic field sensor can include an amplifier coupled to receive the magnetic field signal and generate an amplified signal for coupling to the filter circuit. The filter circuit can include a first sampling capacitor, a first filter switch configured to be in a closed position to couple the amplified signal to the first sampling capacitor or in an open position to decouple the amplified signal from the first sampling capacitor, a second sampling capacitor, a second filter switch configured to be in a closed position to couple the amplified signal to the second sampling capacitor or in an open position to decouple the amplified signal from the second sampling capacitor, and an averaging circuit coupled to the first and second sampling capacitors to generate the filtered signal as an average of a voltage across the first and second sampling capacitors. The diagnostic circuit can include a diagnostic signal generator configured to generate the diagnostic signal. The diagnostic signal generator can include a current source and a variable resistor. The diagnostic circuit can further include a first diagnostic switch configured to be in a closed position to couple the diagnostic signal to the first sampling capacitor or in an open position to decouple the diagnostic signal from the first sampling capacitor and a second diagnostic switch configured to be in a closed position to couple the diagnostic signal to the second sampling capacitor or in an open position to decouple the diagnostic signal from the second sampling capacitor. The diagnostic signal can be a percentage of the Schmitt trigger threshold. The diagnostic signal can be an absolute value above or below the Schmitt trigger threshold. The filter can comprise a sinc filter. In embodiments, the first time period does not overlap with the second time period. The second time period can be after the magnetic field sensor switches.

Also described is a method for performing diagnostic testing of a magnetic field sensor including generating, with one or more magnetic field sensing elements, a first signal in response to a magnetic field, filtering a second signal indicative of the magnetic field signal to generate a filtered signal during a first time period, comparing the filtered signal to a Schmitt trigger threshold during the first time period, generating a diagnostic signal, coupling the diagnostic signal to the filter during a second time period, and comparing the diagnostic signal to the Schmitt trigger threshold during the second time period to generate an output signal indicative of a failure of the Schmitt trigger threshold. The method can further include amplifying the first signal generated in response to the magnetic field to generate the signal indicative of the magnetic field. The first time period does not overlap with the second time period. The diagnostic signal can be generated by a diagnostic circuit comprising a first diagnostic switch configured to be in a closed position to couple the diagnostic signal to a first sampling capacitor or in an open position to decouple the diagnostic signal from the first sampling capacitor, and a second diagnostic switch configured to be in a closed position to couple the diagnostic signal to a second sampling capacitor or in an open position to decouple the diagnostic signal from the second sampling capacitor.

According to a further aspect, an apparatus comprises means for generating a first signal in response to a magnetic field, means for filtering a second signal indicative of the magnetic field signal to generate a filtered signal during a first time period, means for comparing the filtered signal to a Schmitt trigger threshold during the first time period, means for generating a diagnostic signal, means for coupling the diagnostic signal to the filtering means during a second time period, and means for comparing the diagnostic signal to the Schmitt trigger threshold during the second time period to generate an output signal indicative of a failure of the Schmitt trigger threshold. The apparatus can further include means for amplifying the first signal generated in response to the magnetic field to generate the second signal indicative of the magnetic field. The filtering means can include a first sampling capacitor, a first filter switch configured to be in a closed position to couple the second signal to the first sampling capacitor or in an open position to decouple the second signal from the first sampling capacitor, a second sampling capacitor, a second filter switch configured to be in a closed position to couple the second signal to the second sampling capacitor or in an open position to decouple the second signal from the second sampling capacitor, and an averaging circuit coupled to the first and second sampling capacitors to generate the filtered signal as an average of a voltage across the first and second sampling capacitors. The means for coupling the diagnostic signal to the filtering means can comprise a first diagnostic switch configured to be in a closed position to couple the diagnostic signal to a first sampling capacitor or in an open position to decouple the diagnostic signal from the first sampling capacitor, and a second diagnostic switch configured to be in a closed position to couple the diagnostic signal to a second sampling capacitor or in an open position to decouple the diagnostic signal from the second sampling capacitor. The means for comparing the diagnostic signal to the Schmitt trigger threshold can be a Schmitt trigger circuit.

BRIEF DESCRIPTION

DETAILED DESCRIPTION

Figure 1:
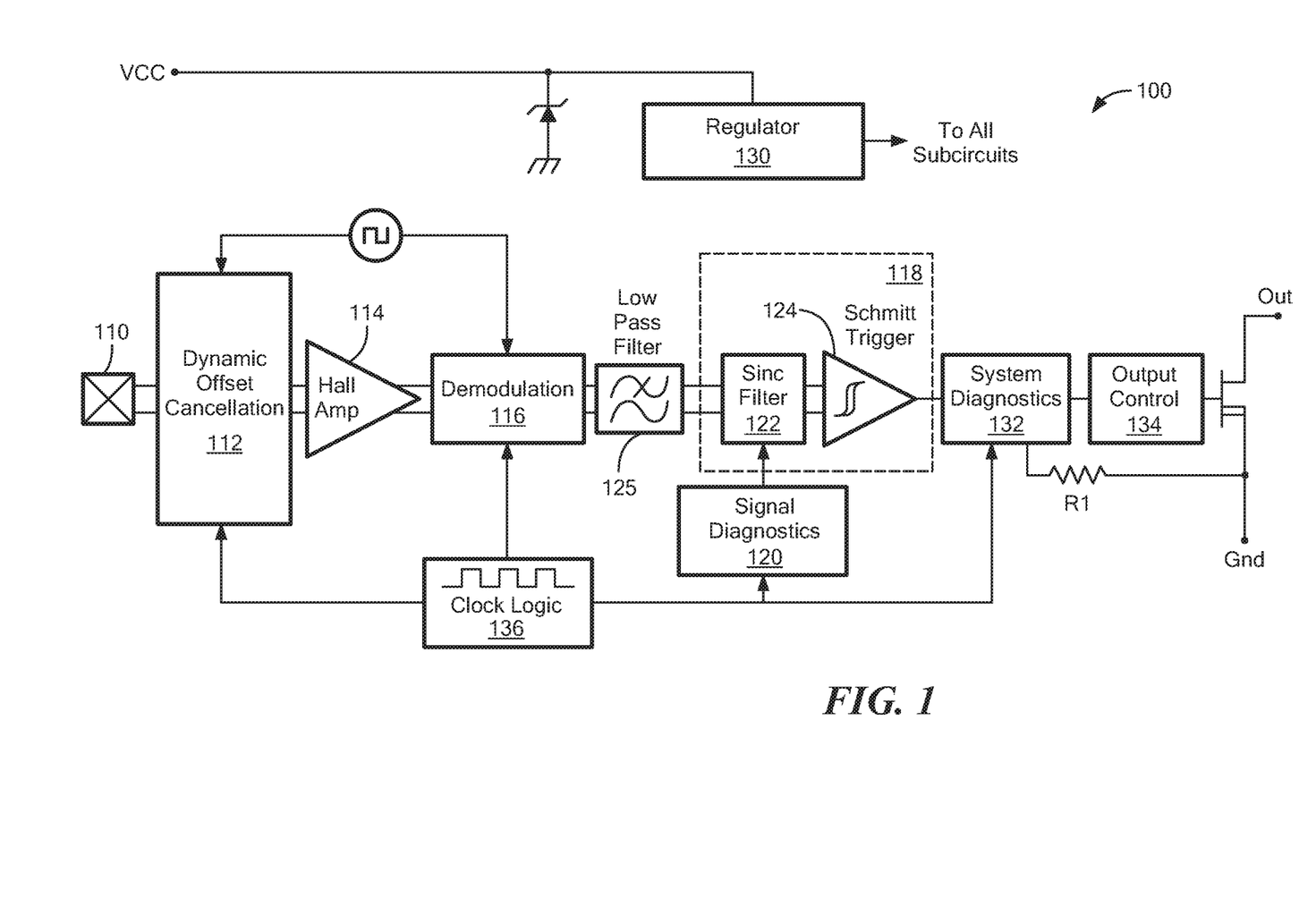
FIG. 1 is a block diagram of a magnetic field sensor, according to an embodiment of the present disclosure.

Referring to FIG. 1, a magnetic field sensor 100 is shown, including a magnetic field sensing element 110 and a signal path 118, according to the present disclosure. The signal path 118 includes a filter circuit 122 and a Schmitt trigger circuit 124, with a diagnostic circuit 120 coupled to the filter circuit 122. In compliance with ASIL (Automotive Safety Integrity Level) requirements, diagnostic signals are used to determine if the sensor 100 incurs failures or is not operating properly. In accordance with the present disclosure, diagnostic test samples are interleaved with the incoming signal at the input of the filter 122 by the diagnostic circuit 120 to verify correct operation of the filter 122 and Schmitt trigger 124. By interleaving the diagnostic signals at the input of the filter, the front-end amplifier (e.g., amplifier 114) is not interrupted by the diagnostics, and the latency added can be as small as a single chopping period. If the front-end amplifier were to be interrupted, this could cause a delay of up to 40 μsecs (microseconds) or more in processing the magnetic field signal. It will be appreciated that, although shown and described with reference to a sinc filter, the filter 122 can be any appropriate averaging filter or other filtering circuit. It will also be appreciated that although sensor 100 used to describe the diagnostic apparatus and methods of the disclosure is a magnetic field sensor, the diagnostics are suitable and beneficial for use with any type of sensor utilizing a filter and Schmitt trigger/comparator arrangement, including but not limited to temperature sensors and pressure sensors.

The magnetic field sensor 100 includes a magnetic field sensing element 110 that generates a magnetic field signal responsive to a magnetic field proximate to the magnetic field sensing element 110. The term "magnetic field sensor" 100 or simply "sensor" is used to describe a circuit that includes one or more magnetic field sensing elements, generally in combination with other circuits. The magnetic field sensor can be, for example, a rotation detector, a movement detector, a current sensor, or a proximity detector.

Magnetic field sensor 100 can be used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field.

The magnetic field sensing element 110 can be, but is not limited to, a Hall effect element, a magnetoresistance element, or a magnetotransistor and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

The magnetic field signal generated by the magnetic field sensing element 110 is input to a dynamic offset cancellation circuit 112, which is output to an amplifier 114. The amplifier 114 is coupled to receive the magnetic field signal from the magnetic field sensing element 110 and generate an amplified signal for coupling to the filter circuit 122 (sinc filter). The output of the amplifier 114 is provided to a demodulation block 116, and a low-pass filter 125, and then the filter circuit 122. Dynamic offset cancellation circuit 112 may take various forms including chopping circuitry and may function in conjunction with demodulation block 116 to remove offset that can be associated with the magnetic field sensing element 110 and/or the amplifier 114. For example, offset cancellation circuit 112 can include switches configurable to drive the magnetic field sensing element (e.g., Hall plate) in two or more different directions such that selected drive and signal contact pairs are interchanged during each phase of the chopping clock signal and offset voltages of the different driving arrangements tend to cancel. The low-pass filter circuit 125 can be designed to remove undesirable spectral components in the resulting signal to generate a filtered signal for coupling to signal path 118.

The diagnostic circuit 120 is coupled to the sinc filter 122, which is also coupled to Schmitt trigger 124. The diagnostic circuit 120, filter circuit 122, and Schmitt trigger circuit 124 are shown in greater detail in FIG. 2. Suffice it to say here that the filter 122 functions to average two or more samples of the magnetic field signal in order to remove any of the filtered Hall Plate offset and front-end amplifier offset, which are at the chopping frequency and the output of the sinc filter 122 is compared to a reference voltage by the Schmitt trigger circuit 124.

More particularly, during "signal cycles" of the sensor operation, the Schmitt trigger 124 compares the filtered signal (from the sinc filter 122) to a Schmitt reference or threshold (internal to the Schmitt trigger circuit 124). During interleaved "diagnostic cycles" of the sensor operation, the Schmitt trigger 124 compares a diagnostic signal (from diagnostic circuit 120) to the Schmitt threshold.

The diagnostic circuit 120 is coupled to the sinc filter 122 and is configured to interleave a diagnostic signal with the magnetic field signal, as will be appreciated in light of the present disclosure. The diagnostic circuit 120 can generate the diagnostic signal using a current DAC source passing through a resistor, as shown in greater detail in FIG. 2, for example. Thus, by changing either the amount of current or the resistor value, the diagnostic signal can be set to be a predetermined percentage or an absolute value greater than or less than the Schmitt threshold. The diagnostic signal is used to ensure that the sinc filter 122 and Schmitt trigger 124 are operating properly.

The output of the Schmitt trigger 124 is coupled to system diagnostics controller, or processor 132 that is configured to generate through output control 134, an output signal of the sensor 100 at output pin OUT. The sensor output signal can take various forms, such as a voltage signal in the case of a so-called three-wire output configuration as shown or a current signal in the case of a so-called two-wire output in which the output signal information is provided in the form of current pulses on the power and ground connections to the sensor. Also, it will be appreciated that various sensor output signal formats are possible.

Functionality of the controller 132 will be described further below. As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module. A regulator 130 is coupled between a supply voltage VCC and ground and to the various components and sub-circuits of the sensor 100 to regulate the voltage supplied thereto.

Figure 2:
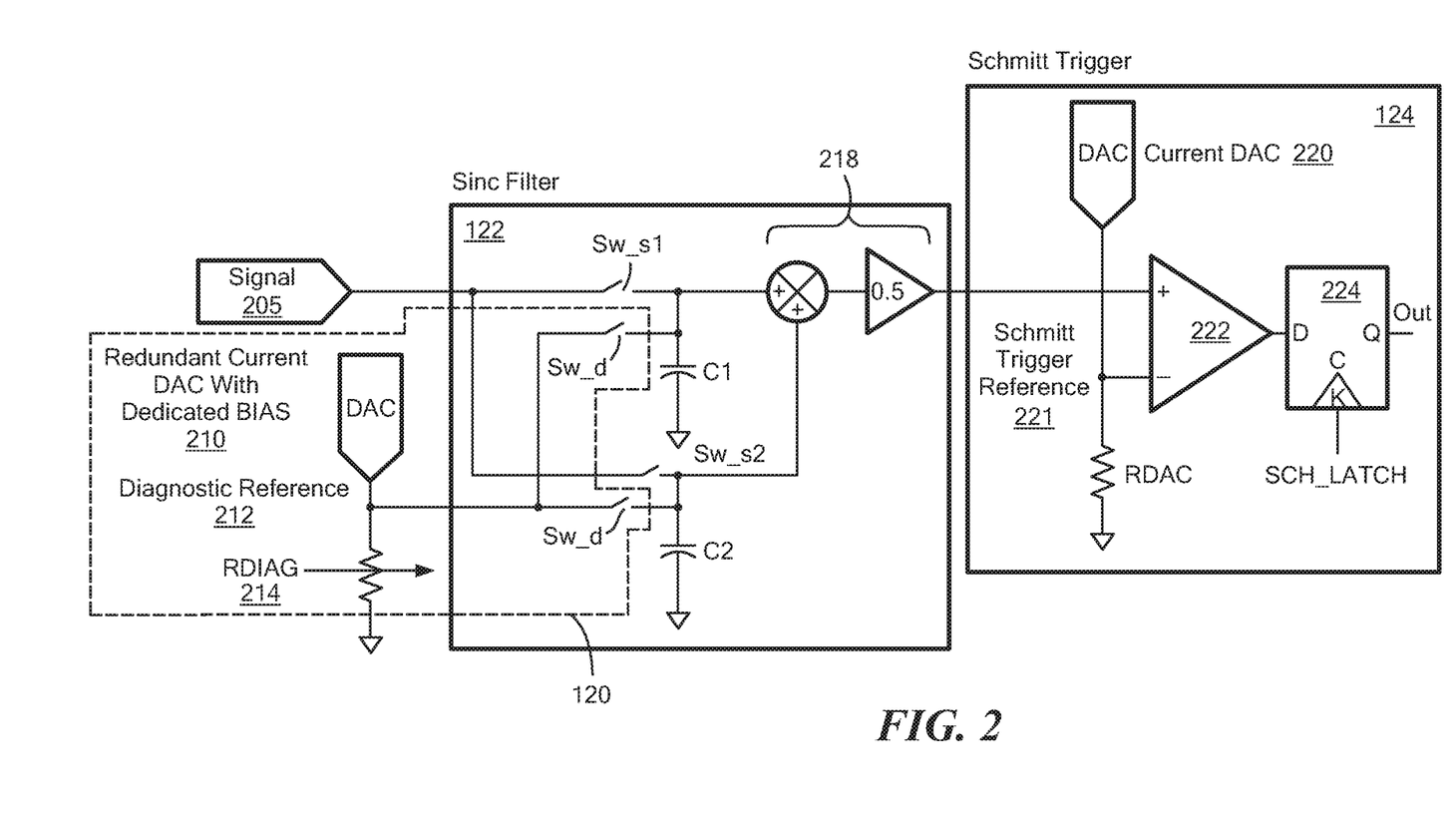
FIG. 2 is a block diagram showing the filter circuit, the Schmitt trigger circuit, and the diagnostic circuit of FIG. 1 in greater detail, in accordance with an embodiment of the present disclosure.

Referring also to FIG. 2, the sinc filter circuit 122, the Schmitt trigger circuit 124, and the diagnostic circuit 120 are shown in greater detail. Signal 205, that may be the same as or similar to the signal at the output of low pass filter 125, is coupled to the filter circuit 122. It will be appreciated that the "front end" components and configuration of the sensor 100 can vary, for example by eliminating chopping. Thus, in general, the sinc filter circuit 122 receives a signal representative of the magnetic field signal generated by the sensing element 110.

The sine filter 122 includes a first sampling capacitor C1, a first filter switch Sw_s1, a second sampling capacitor C2, a second filter switch Sw_s2, and an averaging circuit 218. The sine filter circuit 122 averages two samples using two switches Sw_s1 and Sw_s2 that take the samples at the chopping frequency, which samples are then averaged at the averaging circuit 218. The averaging circuit 218 is coupled to the first and second sampling capacitors C1 and C2 to average a voltage across the first and second sampling capacitors C1 and C2 and generate a filtered signal. The filter circuit 122 may be a sine filter or other appropriate filtering circuit capable of performing the functions described herein including but not limited to a finite impulse response (FIR) filter. The first filter switch Sw_s1 is configured to be in a closed position to couple the amplified signal (e.g., 205) to the first sampling capacitor C1, or in an open position to decouple the amplified signal from the first sampling capacitor C1. The second filter switch Sw_s2 is configured to be in a closed position to couple the amplified signal (e.g., 205) to the second sampling capacitor C2, or in an open position to decouple the amplified signal from the second sampling capacitor C2.

It will be appreciated in light of the present disclosure that two switches Sw_s1 and Sw_s2 are shown to capture two samples per signal cycle, however more than two switches can be implemented to capture more than two samples at the chopping frequency. For example, four switches can be provided to generate four samples per signal cycle. Further, the samples can be weighted by the same weight or by a different weight. Additionally, although the system illustrates a single-ended signal for simplicity in explanation, it will be appreciated that the same concepts can be applied to differential signals.

The output of the sine filter 122 is compared to a reference voltage at the Schmitt trigger circuit 124 that includes a comparator 222 and latch 224. The comparator 222 is configured to compare a Schmitt trigger reference voltage or threshold 221 to the output of the sine filter 122. It should be understood that a so-called "comparator" can be comprised of an analog comparator having a two state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

The reference voltage 221 is generated by a current (e.g., from a current DAC 220) passing through a resistor RDAC. The reference voltage 221 is changed between an operate point (BOP, the level of a strengthening magnetic field at which the sensor switches on) and a release point (BRP, the level of a weakening magnetic field at which the sensor switches off) by a controller (e.g., controller 132 in FIG. 1) according to the state of the comparator output. The difference between the BOP and BRP reference voltage levels corresponds to the hysteresis of the sensor and permits clean output switching even in the presence of mechanical vibration and electrical noise.

The output of the comparator 222 is coupled to an input of a latch 224. The output of the comparator 222 is sampled at each rising edge of the signal SCH_LATCH (shown in FIG. 3) and the state of the switch (i.e., the output of latch 224) is updated.

In order to verify correct operation of the sinc filter circuit 122 and the Schmitt trigger circuit 124, diagnostic test samples are interleaved at the input of the sinc filter circuit 122 with samples of signal 205. According to the present disclosure, a diagnostic test sample is inserted after each pair of signal samples.

The diagnostic circuit 120 includes a diagnostic signal generator configured to generate the diagnostic signal 212. In this example, the diagnostic signal generator comprises a current source 210 and a variable resistor 214 RDIAG. The diagnostic circuit 120 further includes first and second diagnostic switches Sw_d. Both switches Sw_d are closed at the same time to sample the diagnostic reference 212 during the diagnostic signal cycles.

The diagnostic reference 212 is a replica of the Schmitt trigger reference 221, however it can be set to be a percentage (or an absolute value) higher or lower than the Schmitt trigger reference, by either changing the value of RDIAG 214 or current DAC 210. The diagnostic signal 212 can be a predetermined percentage (or an absolute value) higher or lower than the Schmitt trigger threshold. Thus, changing RDIAG 214 to be a percentage (or an absolute value) higher or lower than the Schmitt resistor RDAC, or increasing current from DAC 210 to be a percentage (or an absolute value) higher or lower than the current from DAC 220, causes diagnostic reference 212 to be offset accordingly from the Schmitt trigger reference 221. Accordingly, the system diagnostics controller 132 (FIG. 1) can evaluate if the Schmitt trigger 124 responds correctly for a given diagnostic reference value, by determining if the comparator output goes high or low as expected for the given diagnostic reference. If a failure is detected, the sensor 100 can go into a safe mode or the failure can remain as a latent fault, as will be described in greater detail herein.

Figure 3:
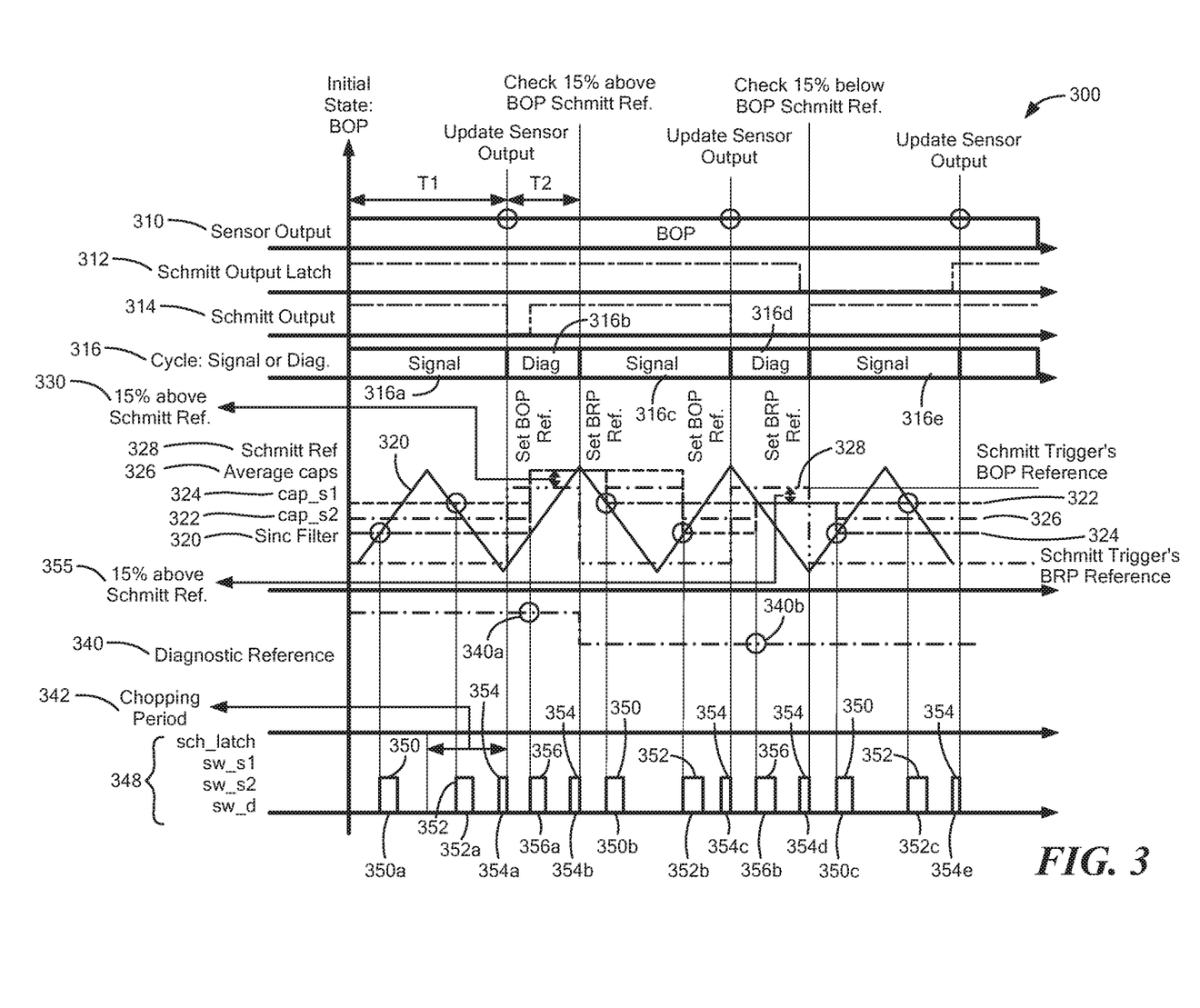
FIG. 3 is a graphical diagram showing example signals associated with the sensor of FIGS. 1 and 2, where no failure is detected during either the first or second diagnostic cycles.

Referring also to FIG. 3, example signals associated with the sensor 100 of FIGS. 1 and 2 are shown, including the sensor output 310, Schmitt output latch 312, Schmitt output 314, and cycle indicator 316 indicated as either a "signal cycle" (e.g., 316a, 316c, 316e) or a "diagnostic cycle" (e.g., 316b, 316d). Signal cycles 316a, 316c, 316e occur during first time periods (e.g., T1) when the sensor 100 evaluates the magnetic field signal and diagnostic cycles 316b, 316d occur during second time periods (e.g., T2) when the sensor evaluates signals from the diagnostic circuit 120. More particularly, during diagnostic cycles 316b, 316d, diagnostic samples are interleaved into the sinc filter 122 and are used to test the functionality of the sinc filter 122 and Schmitt trigger 124. In the example waveforms of FIG. 3, one diagnostic sample is interleaved after each pair of signal samples and there are no system failures present in the sinc filter 122 or the Schmitt trigger 124. It will be appreciated however, that other numbers of diagnostic samples can be interleaved and that such diagnostic samples can be interleaved less frequently than after each pair of signal samples. The sensor output 310 can be the same as or similar to the signal provided at the OUT pin (FIG. 1), the Schmitt output latch 312 can be provided at the output of the Schmitt trigger latch 224, and the Schmitt output 314 can be provided at the output of the comparator 222.

Control signals 348, as may be generated by clock logic 136 under the control of controller 132, control various sensor functionality and include the SCH_LATCH signal 354 for coupling to the latch 224. The latch 224 can be updated on the rising edge of the SCH_LATCH pulses 354a-354e and the sensor output 310 can be latched on the falling edge of the SCH_LATCH pulses 354a-354e. The chopping period 342 for the control signals 348 is shown.

Switch control signal 350 including pulses 350a 350b, 350c controls sampling switch Sw_s1 and switch control signal 352 including pulses 352a, 352b, 352c controls sampling switch Sw_s2. Switches Sw_s1 and Sw_s2 are closed at non-overlapping times during each signal cycle 316a, 316c, 316e to sample the signal 205 representative of the magnetic field signal. Switch control signal 356 including pulses 356a, 356b controls diagnostic switches Sw_d. Switches Sw_d are simultaneously closed during each diagnostic cycle 316b, 316d to sample the diagnostic reference signal 212.

An example input signal 205 to the sinc filter is shown by waveform 320. The sampled voltage across capacitor C2 is labelled 322 and the sampled voltage across capacitor C1 is labelled 324. The average of the voltages across capacitors C1 and C2 is shown by waveform 326. During the signal cycles 316a, 316c, 316e, the average 326 is the average of the samples of the signal 205 taken when Sw_s1 and switch Sw_s2 are closed and thus, it is the average of the samples of signal 205 that is compared to the Schmitt trigger reference 221 by the comparator 222. And, during diagnostic cycles 316b, 316d, the average 326 is equal to the sampled diagnostic reference 212 and thus, it is the average of the diagnostic reference samples that is compared to the Schmitt trigger reference 221 by the comparator 222.

The Schmitt trigger reference 221 is shown by waveform 328, as may be generated by a current passing through a resistor (as shown in FIG. 2, for example with DAC 220 and RDAC). If the average 326 is less than the Schmitt trigger reference 328, then the Schmitt output 314 is at a logic low level; whereas, if the average 326 is greater than the Schmitt trigger reference 328, then the Schmitt output 314 is at a logic high level.

During signal cycles 316a, 316c, 316e, the Schmitt reference 328 changes, depending on the state of the sensor output 310 in order to implement the desired hysteresis. If the output 310 is high (as shown), then the Schmitt reference 328 is at the BRP level (as shown during all three signal cycles 316a, 316c, 316e). Whereas, if the output 310 is low, then the Schmitt reference 328 is at the BOP level.

During diagnostic cycles 316b, 316d, the Schmitt trigger reference 328 is forced to the level of whichever of the Schmitt trigger reference levels (i.e., BOP or BRP) is desired to be tested. In the example of FIG. 3, the Schmitt trigger reference 328 is at the operate point BOP to test the BOP reference level (as shown during the diagnostic cycles 316b, 316d).

The diagnostic reference 212 is shown by waveform 340, as may be generated by a current passing through a resistor (as shown in FIG. 2, for example with DAC 210 and RDIAG 214). The interleaved diagnostic signal 212 allows the Schmitt trigger reference level 328 to be verified to ensure that it is within a desired range of operation and also to detect failures in the sinc filter 122 and/or the Schmitt trigger comparator 222. The diagnostic reference waveform 340 is sampled during diagnostic cycle 316b at 340a at the rising edge of Sw_d control pulse 356a, and during the diagnostic cycle 316*d* at 340*b* at the rising edge of Sw_d control pulse 356*b*. In the example of FIG. 3, the diagnostic reference 340 is set to 15% above the Schmitt BOP reference level during the first diagnostic cycle 316*b* and is set to 15% below the Schmitt BOP reference level during the second diagnostic cycle 316*d*. As shown, there is no fault detected in either diagnostic cycle 316*b* or in diagnostic cycle 316*d*, as the diagnostic threshold is within 15% of the Schmitt reference. In the diagnostic cycle 316*b*, at 330 the average 326 is 15% above the Schmitt reference 328, and in the diagnostic cycle 316*d* at 335 the average 326 is 15% below the Schmitt reference 328. Thus, there is no fault and the reference is operating correctly.

Figure 3A:
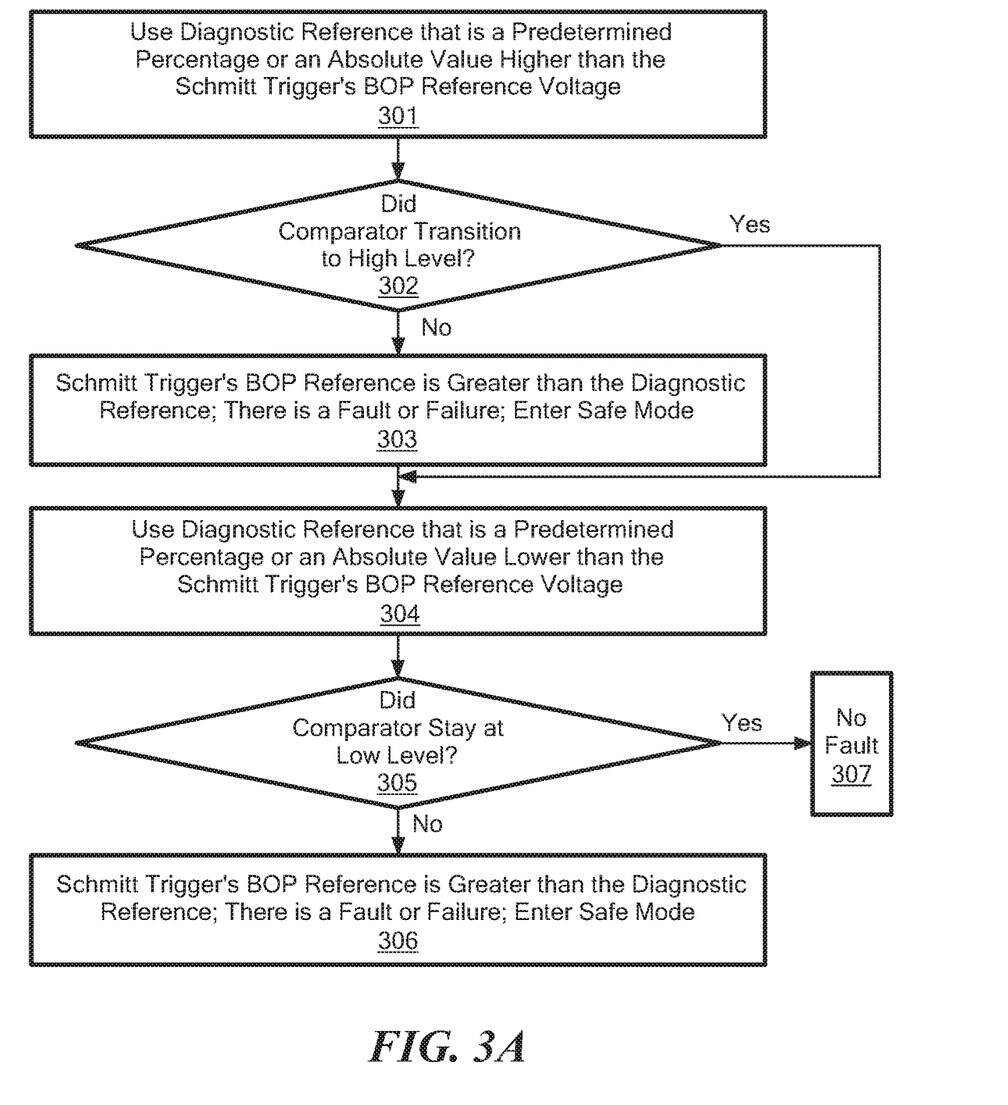
FIG. 3A is a flow chart illustrating an example sensor operation during the diagnostic cycles during which it can be determined if the BOP reference level is within ±15% of its intended value.

Referring also to FIG. 3A, a flow chart illustrates the sensor operation during the diagnostic cycles 316*b*, 316*d* during which is can be determined if the BOP reference level is within ±15% of its intended value. It will be appreciated that the same or similar procedure can be performed to check that BRP reference level is within ±15% (or another percentage, or an absolute value) of its intended value.

The first diagnostic cycle 316*b* (during which it is determined whether the BOP reference level is more than 15% greater than the intended level) corresponds to blocks 301, 302, and 303 and the second diagnostic cycle 316*d* (during which it is determined whether the BOP reference level is more than 15% less than the intended level) corresponds to blocks 304, 305, and 306. It will be appreciated that the order of the blocks can be varied, for example to first test the whether the BOP level is within 15% below the Schmitt reference 328 and thereafter to test whether the BOP level is within 15% above the Schmitt reference 328.

At block 301, the diagnostic reference 340 is set to 15% above the BOP Schmitt reference 328. At block 302, the controller (e.g., controller 132 of FIG. 1) checks to determine if the output of comparator 222 is at the expected level. In the example of FIG. 3A, if the comparator output 314 transitions to a high level (as occurs during diagnostic cycle 316*b*) as expected, then no fault is detected. If the comparator output 314 does not transition to a high level during diagnostic cycle 316*b*, then a fault or failure is determined to have occurred, and the sensor enters safe mode at 303, as will be explained in greater detail below.

If proper operation is determined to have occurred at block 302, then the second diagnostic cycle 316*d* is initiated at block 304. More particularly, at block 304, the diagnostic reference 340 is set to 15% below the BOP Schmitt reference 328. At block 305, the controller (e.g., controller 132 of FIG. 1) checks to determine if the output of comparator 222 is at the expected level. In the example of FIG. 3A, if the comparator output 314 remains at a low level (as occurs during diagnostic cycle 316*d*) as expected, then no fault is detected, and the process proceeds to block 307. If the comparator output 314 transitions to a high level during diagnostic cycle 316*d*, then a fault or failure is determined to have occurred, and the sensor enters safe mode at 306, as will be explained in greater detail below.

Figure 4:
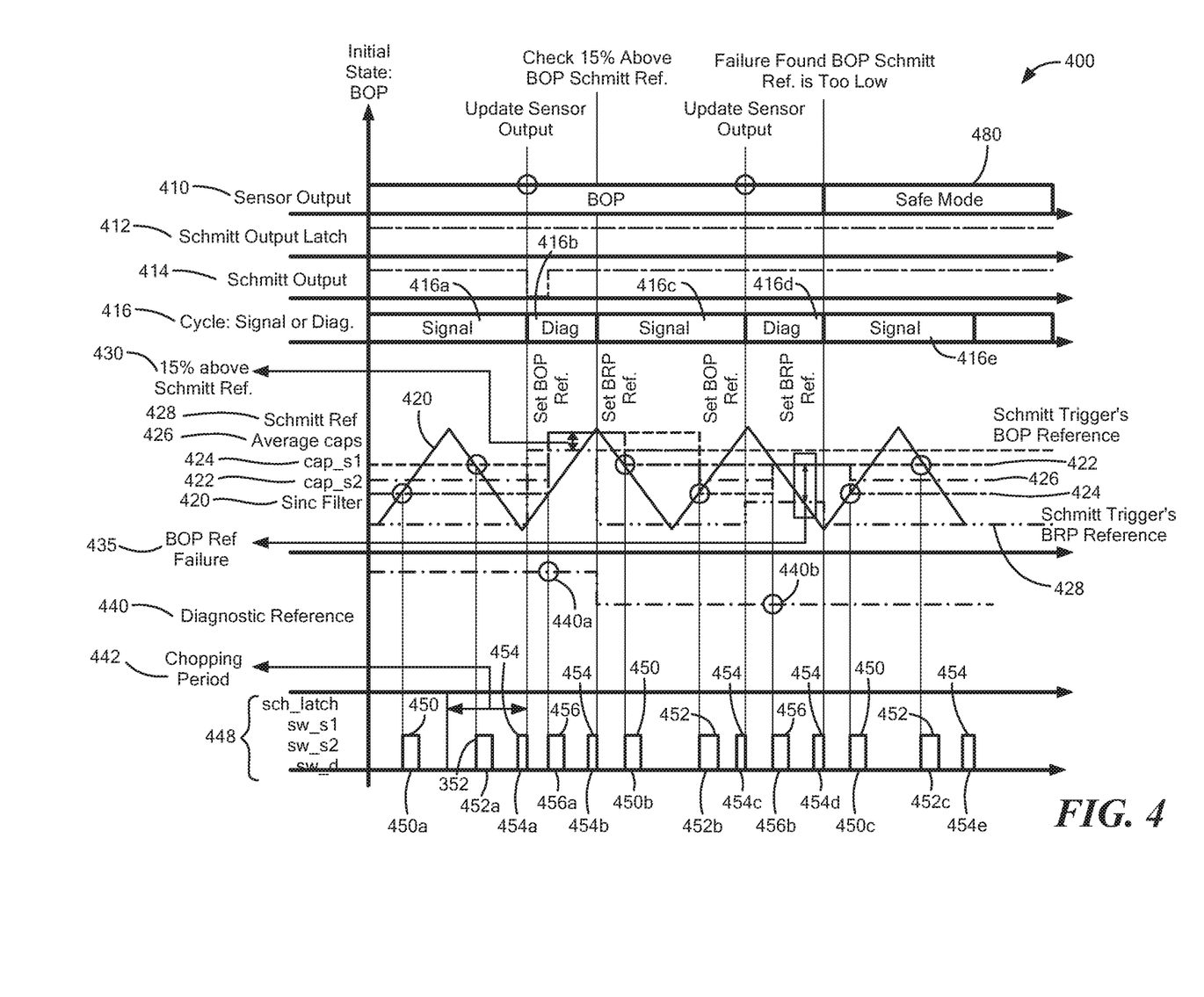
FIG. 4 is a graphical diagram of example signals associated with the sensor of FIGS. 1 and 2, where there is no failure during the first diagnostic cycle and a failure is detected during the second diagnostic cycle.

Referring to FIG. 4, example signals associated with the sensor 100 of FIGS. 1 and 2 are shown, which are similar to the signals shown in FIG. 3, except that a failure is detected during the second diagnostic cycle in the waveforms shown in FIG. 4. The signals shown include the sensor output 410, Schmitt output latch 412, Schmitt output 414, and cycle indicator 416 indicated as either a "signal cycle" (e.g., 416*a*, 416*c*, 416*e*) or a "diagnostic cycle" (e.g., 416*b*, 416*d*). Signal cycles 416*a*, 416*c*, 416*e* occur during first time periods when the sensor 100 evaluates the magnetic field signal and diagnostic cycles 416*b*, 416*d* occur during second time periods when the sensor evaluates signals from the diagnostic circuit 120. More particularly, during diagnostic cycles 416*b*, 416*d*, diagnostic samples are interleaved into the sinc filter 122 and are used to test the functionality of the sinc filter 122 and Schmitt trigger 124. In the example waveforms of FIG. 4, one diagnostic sample is interleaved after each pair of signal samples. It will be appreciated however, that other numbers of diagnostic samples can be interleaved and that such diagnostic samples can be interleaved less frequently than after each pair of signal samples. The sensor output 410 can be the same as or similar to the signal provided at the OUT pin (FIG. 1), the Schmitt output latch 412 can be provided at the output of the Schmitt trigger latch 224, and the Schmitt output 414 can be provided at the output of the comparator 222.

Control signals 448, as may be generated by clock logic 136 under the control of controller 132, control various sensor functionality and include the SCH_LATCH signal 454 for coupling to the latch 224. The latch 224 can be updated on the rising edge of the SCH_LATCH pulses 454*a*-454*e* and the sensor output 410 can be latched on the falling edge of the SCH_LATCH pulses 454*a*-454*e*. The chopping period 442 for the control signals 448 is shown.

Switch control signal 450 including pulses 450*a* 450*b*, 450*c* controls sampling switch Sw_s1 and switch control signal 452 including pulses 452*a*, 452*b*, 452*c* controls sampling switch Sw_s2. Switches Sw_s1 and Sw_s2 are closed at non-overlapping times during each signal cycle 416*a*, 416*c*, 416*e* to sample the signal 205 representative of the magnetic field signal. Switch control signal 456 including pulses 456*a*, 456*b* controls diagnostic switches Sw_d. Switches Sw_d are simultaneously closed during each diagnostic cycle 416*b*, 416*d* to sample the diagnostic reference signal 212.

An example input signal 205 to the sinc filter is shown by waveform 420. The sampled voltage across capacitor C2 is labelled 422 and the sampled voltage across capacitor C1 is labelled 424. The average of the voltages across capacitors C1 and C2 is shown by waveform 426. During the signal cycles 416*a*, 416*c*, 416*e*, the average 426 is the average of the samples of the signal 205 taken when Sw_s1 and switch Sw_s2 are closed and thus, it is the average of the samples of signal 205 that is compared to the Schmitt trigger reference 221 by the comparator 222. And, during diagnostic cycles 416*b*, 416*d*, the average 426 is equal to the sampled diagnostic reference 212 and thus, it is the average of the diagnostic reference samples that is compared to the Schmitt trigger reference 221 by the comparator 222.

The Schmitt trigger reference 221 is shown by waveform 428, as may be generated by a current passing through a resistor (as shown in FIG. 2, for example with DAC 220 and RDAC). If the average 426 is less than the Schmitt trigger reference 428, then the Schmitt output 414 is at a logic low level; whereas, if the average 426 is greater than the Schmitt trigger reference 428, then the Schmitt output 414 is at a logic high level.

During signal cycles 416*a*, 416*c*, 416*e*, the Schmitt reference 428 changes, depending on the state of the sensor output 410 in order to implement the desired hysteresis. If the output 410 is high (as shown), then the Schmitt reference 428 is at the BRP level (as shown during all three signal cycles 416*a*, 416*c*, 416*e*). Whereas, if the output 310 is low, then the Schmitt reference 328 is at the BOP level (as shown during the diagnostic cycles 416*b*, 416*d*). If a failure is detected, the state of the sensor output 410 is a safe state, which can for example be a level higher than the high value indicative of BOP. Thus, the sensor output has at least three states, including the BOP state, the BRP state, and the safe state.

During diagnostic cycles 416b, 416d, the Schmitt trigger reference 428 is forced to the level of whichever of the Schmitt trigger reference levels (i.e., BOP or BRP) is desired to be tested. In the example of FIG. 4, the Schmitt trigger reference 328 is at the operate point BOP to test the BOP reference level (as shown during diagnostic cycles 416b, 416d).

The diagnostic reference 212 is shown by waveform 440, as may be generated by a current passing through a resistor (as shown in FIG. 2, for example with DAC 210 and RDIAG 214). The interleaved diagnostic signal 212 allows the Schmitt trigger reference level 428 to be verified to ensure that it is within a desired range of operation and also to detect failures in the sinc filter 122 and/or the Schmitt trigger comparator 222. The diagnostic reference waveform 440 is sampled during the diagnostic cycle 416b at 440a at the rising edge of Sw_d control pulse 456a, and during the diagnostic cycle 416d at 440b at the rising edge of Sw_d control pulse 456b. In the example of FIG. 4, the diagnostic reference 440 is set to 15% above the Schmitt BOP reference level during the first diagnostic cycle 416b and is set to 15% below the Schmitt BOP reference level during the second diagnostic cycle 416d. As shown, there is no fault detected in the first diagnostic cycle 416b because the Schmitt output 414 transitions to a high level as expected. However, in the second diagnostic cycle 416d, the Schmitt output 414 does not transition to a low level as expected, thereby indicating a fault. In the diagnostic cycle 416b, at 430 the average 426 is 15% above the Schmitt reference, indicating no fault. However, in the diagnostic cycle 416d, at 435 the average 426 is more than 15% above the Schmitt reference, indicative of BOP reference failure. The sensor output 410 is then transitioned into safe mode 480.

Figure 5:
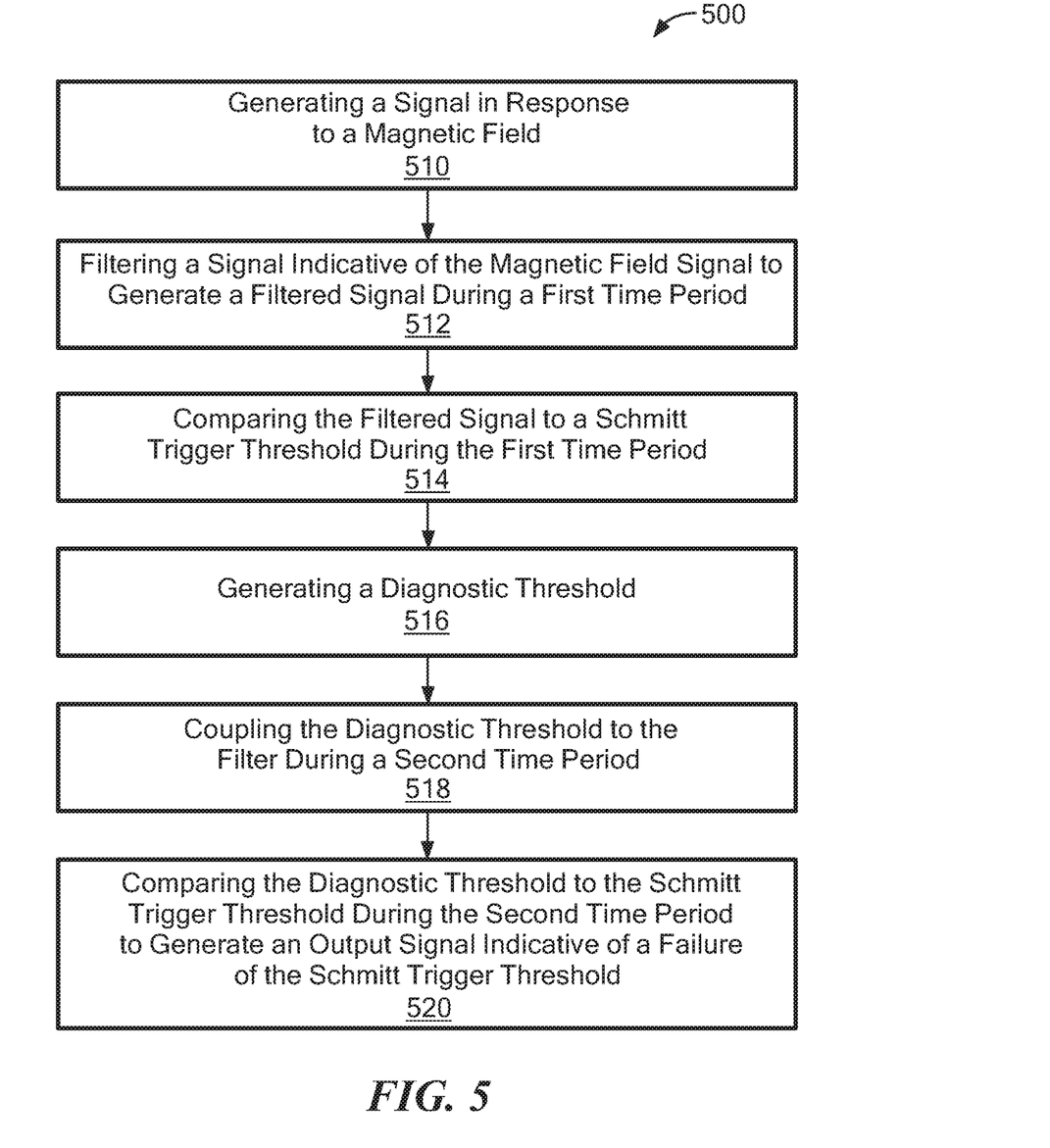
FIG. 5 is a flow chart of an example process for performing diagnostic testing of a sinc filter circuit and a Schmitt trigger of a magnetic field sensor, in accordance with an embodiment of the present disclosure.

FIG. 5 is a flow chart illustrating an example process 500 for performing diagnostic testing of a sinc filter circuit and a Schmitt trigger of a sensor, in accordance with the present disclosure. At block 510, the process 500 starts by generating a signal in response to a magnetic field signal. The signal generated in response to the magnetic field signal can, for example, be generated by the magnetic field sensing element 110 of FIG. 1.

At block 512, the process 500 continues by filtering the signal indicative of the magnetic field signal to generate a filtered signal during a first time period. The filtering can be performed, for example, by the filtering circuit 122 of FIG. 1. The signal filtered by the filtering circuit 122 can be received directly from the magnetic field sensing element 110, or from other intermediate component(s) between the magnetic field sensing element 110 and the filtering circuit 122. For example, there may be an amplifier (e.g., amplifier 114 in FIG. 1) that amplifies the signal prior to filtering, or a modulation and demodulation process (e.g., chopping elements 112, 116 in FIG. 1) prior to filtering the signal.

At block 514, the process 500 continues by comparing the filtered signal to the Schmitt trigger reference during a first time period. This can be performed, for example, by the Schmitt trigger circuit 124 shown in FIG. 1. The first time period during which the filtered signal is generated and compared to a Schmitt trigger threshold is, for example, period T1 shown in FIG. 3, which occurs during the signal cycle 316a.

At block 516, the process 500 continues by generating a diagnostic threshold signal. The diagnostic signal can be generated, for example, by a diagnostic circuit 120 shown in FIG. 1, which is coupled to the filter circuit 122.

At block 518, the process 500 continues by coupling the diagnostic threshold signal to the filter circuit (e.g., filter circuit 122) during the second time period. At block 520, the process 500 continues by comparing the diagnostic threshold signal to the Schmitt trigger reference during the second time period. The comparison can be performed, for example, by the Schmitt trigger circuit 124. A signal indicative of failure is output when the diagnostic signal is more than a predetermined percentage greater than or less than the Schmitt trigger reference. The second time period during which the diagnostic threshold is compared to the Schmitt trigger threshold is, for example, period T2 shown in FIG. 3, which occurs during the diagnostic cycle 316b.

Figure 6:
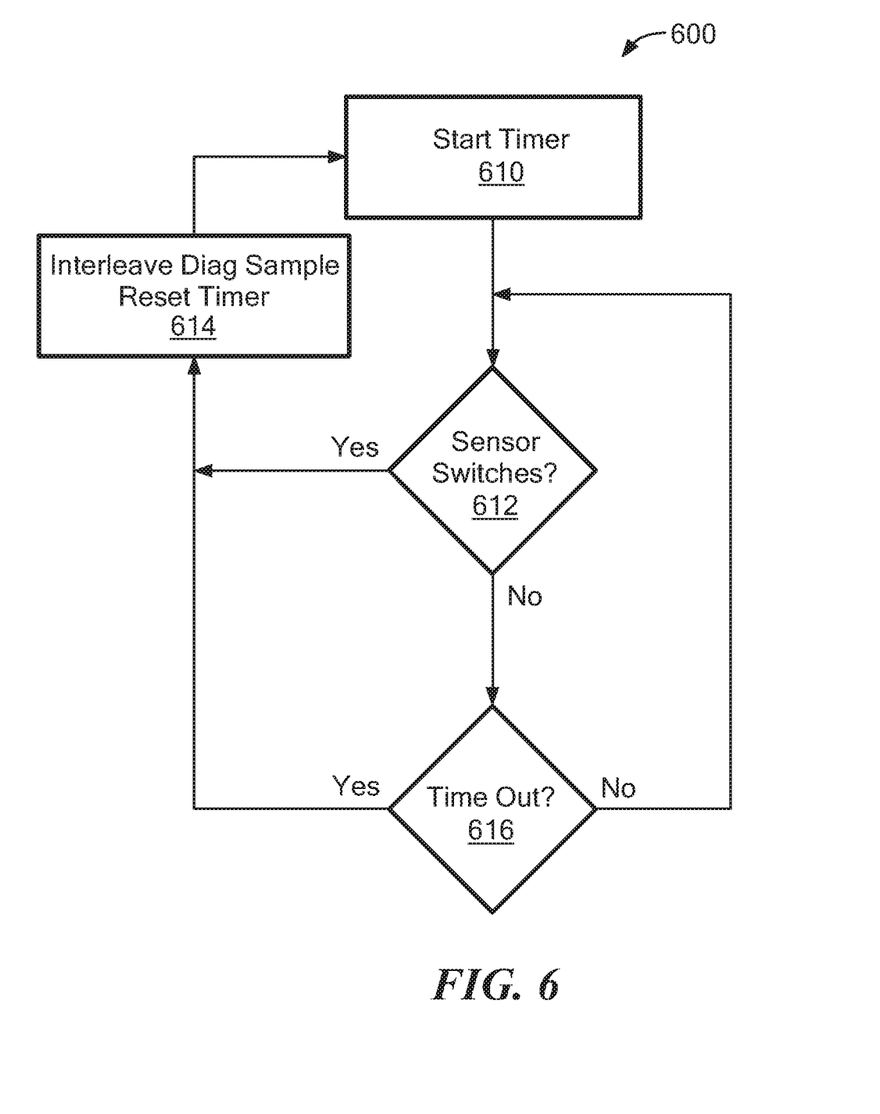
FIG. 6 is a flow chart illustrating an example process for timing the interleaving of the diagnostic signal in accordance with an embodiment of the present disclosure.

FIG. 6 is a flow chart illustrating an example process for timing the interleaving of the diagnostic signal so as to not worsen jitter due to the interleaving, in accordance with an embodiment of the present disclosure. Given that a diagnostic signal is being interleaved with a magnetic field signal, this can result in increased (worsened) jitter. One way to reduce (or prevent worsening) jitter due to the interleaving is to decide when to interleave the diagnostic signal. By interleaving the diagnostic signal when the part switches, the jitter can be reduced or at least not worsened.

FIG. 6 shows an example process 600 for timing the interleaving of the diagnostic signals in accordance with the present disclosure to reduce, or at least not worsen, jitter due to the interleaved diagnostic signal. At block 610, the process 600 starts a timer as may be part of the controller 132 (FIG. 1). The timer can be set to a minimum amount of time between switching of the output (e.g., 1 microsecond). By knowing this set minimum amount of time, the diagnostic signal can be interleaved at a time that does not affect operation of the part. At block 612, the process 600 checks to determine if the sensor switched. If the sensor switches at 612, then at block 614 the diagnostic sample is interleaved and the timer is reset.

If the sensor has not switched at 612, the process 600 checks at block 616 to determine if there has been a timeout of the timer. If there has not been a timeout of the timer at block 616, the process 600 returns to block 612. If yes there has been a timeout at block 616, then the process 600 proceeds to block 614 to interleave the diagnostic sample and reset the timer and then to block 610 to start the timer and repeat the process 600 as needed.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A magnetic field sensor comprising:
one or more magnetic field sensing elements configured to generate a magnetic field signal responsive of a magnetic field;
a filter circuit coupled to receive a signal representative of the magnetic field signal and configured to generate a filtered signal;
a Schmitt trigger circuit coupled to receive the filtered signal and configured to compare the filtered signal to a Schmitt trigger threshold during a first time period to evaluate the magnetic field signal; and
a diagnostic circuit configured to directly input a diagnostic signal to an input of the filter circuit, wherein the Schmitt trigger circuit is configured to compare the Schmitt trigger threshold to the diagnostic signal during a second time period to test the functionality of the filter circuit and the Schmitt trigger circuit.

2. The magnetic field sensor of claim 1, further comprising an amplifier coupled to receive the magnetic field signal and generate an amplified signal for coupling to the filter circuit.

3. The magnetic field sensor of claim 2, wherein the filter circuit comprises:
a first sampling capacitor;
a first filter switch configured to be in a closed position to couple the amplified signal to the first sampling capacitor or in an open position to decouple the amplified signal from the first sampling capacitor;
a second sampling capacitor;
a second filter switch configured to be in a closed position to couple the amplified signal to the second sampling capacitor or in an open position to decouple the amplified signal from the second sampling capacitor; and
an averaging circuit coupled to the first and second sampling capacitors to generate the filtered signal as an average of a voltage across the first and second sampling capacitors.

4. The magnetic field sensor of claim 3, wherein the diagnostic circuit comprises a diagnostic signal generator configured to generate the diagnostic signal.

5. The magnetic field sensor of claim 4, wherein the diagnostic signal generator comprises a current source and a variable resistor.

6. The magnetic field sensor of claim 4, wherein the diagnostic circuit further comprises:
a first diagnostic switch configured to be in a closed position to couple the diagnostic signal to the first sampling capacitor or in an open position to decouple the diagnostic signal from the first sampling capacitor; and
a second diagnostic switch configured to be in a closed position to couple the diagnostic signal to the second sampling capacitor or in an open position to decouple the diagnostic signal from the second sampling capacitor.

7. The magnetic field sensor of claim 1, wherein the diagnostic signal is a percentage of the Schmitt trigger threshold.

8. The magnetic field sensor of claim 1, wherein the diagnostic signal is an absolute value above or below the Schmitt trigger threshold.

9. The magnetic field sensor of claim 1, wherein the filter comprises a sinc filter.

10. The magnetic field sensor of claim 1, wherein the first time period does not overlap with the second time period.

11. The magnetic field sensor of claim 1, wherein the second time period is after the magnetic field sensor switches.

12. A method for performing diagnostic testing of a magnetic field sensor, comprising:
generating, with one or more magnetic field sensing elements, a first signal in response to a magnetic field;
filtering, with a filter, a second signal indicative of the magnetic field signal to generate a filtered signal during a first time period;
comparing the filtered signal to a Schmitt trigger threshold during the first time period to evaluate the first signal;
generating a diagnostic signal;
directly inputting the diagnostic signal to an input of the filter during a second time period; and
comparing the diagnostic signal to the Schmitt trigger threshold during the second time period to generate an output signal indicative of a functionality of the filter and the Schmitt trigger.

13. The method of claim 12, further comprising amplifying the first signal generated in response to the magnetic field to generate the signal indicative of the magnetic field.

14. The method of claim 12, wherein the first time period does not overlap with the second time period.

15. The method of claim 12, wherein the diagnostic signal is generated by a diagnostic circuit comprising:
a first diagnostic switch configured to be in a closed position to couple the diagnostic signal to a first sampling capacitor or in an open position to decouple the diagnostic signal from the first sampling capacitor; and
a second diagnostic switch configured to be in a closed position to couple the diagnostic signal to a second sampling capacitor or in an open position to decouple the diagnostic signal from the second sampling capacitor.

16. An apparatus comprising:
means for generating a first signal in response to a magnetic field;
means for filtering a second signal indicative of the magnetic field signal to generate a filtered signal during a first time period;
means for comparing the filtered signal to a Schmitt trigger threshold during the first time period to evaluate the first signal;
means for generating a diagnostic signal;
means for directly inputting the diagnostic signal to an input of the filtering means during a second time period; and
means for comparing the diagnostic signal to the Schmitt trigger threshold during the second time period to generate an output signal indicative of a functionality of the filtering means and the Schmitt trigger.

17. The apparatus of claim 16, further comprising:
means for amplifying the first signal generated in response to the magnetic field to generate the second signal indicative of the magnetic field.

18. The apparatus of claim 17, wherein the filtering means comprises:
a first sampling capacitor;
a first filter switch configured to be in a closed position to couple the second signal to the first sampling capacitor or in an open position to decouple the second signal from the first sampling capacitor;
a second sampling capacitor;

a second filter switch configured to be in a closed position to couple the second signal to the second sampling capacitor or in an open position to decouple the second signal from the second sampling capacitor; and an averaging circuit coupled to the first and second sampling capacitors to generate the filtered signal as an average of a voltage across the first and second sampling capacitors.

19. The apparatus of claim 16, wherein the means for coupling the diagnostic signal to the filtering means comprises:

a first diagnostic switch configured to be in a closed position to couple the diagnostic signal to a first sampling capacitor or in an open position to decouple the diagnostic signal from the first sampling capacitor; and a second diagnostic switch configured to be in a closed position to couple the diagnostic signal to a second sampling capacitor or in an open position to decouple the diagnostic signal from the second sampling capacitor.

20. The apparatus of claim 16, wherein the means for comparing the diagnostic signal to the Schmitt trigger threshold is a Schmitt trigger circuit.

* * * * *

UNITED STATES PATENT AND TRADEMARK OFFICE
CERTIFICATE OF CORRECTION

PATENT NO. : 10,746,814 B2
APPLICATION NO. : 16/014075
DATED : August 18, 2020
INVENTOR(S) : Ezequiel Rubinsztain et al.

Page 1 of 1

It is certified that error appears in the above-identified patent and that said Letters Patent is hereby corrected as shown below:

In the Specification

Column 6, Line 11 delete "sine" and replace with -- sinc --.

Column 6, Line 14 delete "sine" and replace with -- sinc --.

Column 6, Line 21 delete "sine" and replace with -- sinc --.

Column 6, Line 44 delete "sine" and replace with -- sinc --.

Column 6, Line 48 delete "sine" and replace with -- sinc --.

Column 6, Line 64 delete "sine" and replace with -- sinc --.

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*